US012774205B2

(12) United States Patent
Liu et al.

(10) Patent No.: US 12,774,205 B2
(45) Date of Patent: Oct. 27, 2026

(54) METHODS AND APPARATUS FOR SEMICONDUCTOR PACKAGES WITH WINDOW ASSEMBLIES

(71) Applicant: Texas Instruments Incorporated, Dallas, TX (US)

(72) Inventors: Jane Liu, Plano, TX (US); Osvaldo Enriquez, Lewisville, TX (US); Rafael S. Mendoza, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 464 days.

(21) Appl. No.: 18/142,779

(22) Filed: May 3, 2023

(65) Prior Publication Data

US 2024/0228265 A1 Jul. 11, 2024

Related U.S. Application Data

(60) Provisional application No. 63/478,509, filed on Jan. 5, 2023.

(51) Int. Cl.

*B81B 7/00* (2006.01)
*B81C 1/00* (2006.01)
*G02B 26/08* (2006.01)

(52) U.S. Cl.

CPC ........ *B81B 7/0054* (2013.01); *B81C 1/00317* (2013.01); *G02B 26/0833* (2013.01); *B81B 2201/042* (2013.01); *B81C 2203/019* (2013.01)

(58) Field of Classification Search

CPC ..... H01L 2224/02215; H01L 2224/022; H01L 2224/02205; H01L 2224/0221; H01L 2924/15153; H01L 2924/163; H01L 23/055; H01L 23/053; H01L 23/3135; B81C 1/00325; B81C 1/00317; B81C 1/00269; B81C 2203/0109; B81C 2203/019; B81B 7/0006; B81B 7/0051; B81B 7/004; B81B 7/0045; G02B 6/0841; G02B 6/0833; H10W 74/121

See application file for complete search history.

(56) References Cited

U.S. PATENT DOCUMENTS

| | | | | | |
|---|---|---|---|---|---|
| 10,710,875 | B2 | 7/2020 | Liu et al. | | |
| 2007/0029562 | A1* | 2/2007 | Koizumi | B81B 7/0041 | 257/98 |
| 2007/0254403 | A1* | 11/2007 | Fisher | B81B 7/0038 | 438/106 |
| 2009/0008669 | A1* | 1/2009 | Maeda | G02B 26/0841 | 257/E33.001 |
| 2010/0110527 | A1* | 5/2010 | Liu | G02B 7/008 | 359/291 |
| 2010/0213621 | A1* | 8/2010 | Sun | H10W 74/117 | 257/E23.116 |

(Continued)

*Primary Examiner* — Alia Sabur

(74) *Attorney, Agent, or Firm* — Michael T. Gabrik; Charles F. Koch

(57) ABSTRACT

Systems, apparatus, articles of manufacture, and methods to reduce delamination of layers in semiconductor packages with window assemblies are disclosed. An apparatus comprising: a translucent panel, a semiconductor substrate, a stack of bonding materials between the translucent panel and the semiconductor substrate, and a buffer material extending along a lateral side of the stack of bonding materials.

20 Claims, 11 Drawing Sheets

(56) References Cited

U.S. PATENT DOCUMENTS

| | | | | |
|---|---|---|---|---|
| 2013/0119493 | A1* | 5/2013 | Chou | B81C 1/00825 438/51 |
| 2015/0210538 | A1* | 7/2015 | Su | G02B 27/0006 257/704 |
| 2016/0159639 | A1* | 6/2016 | Van Der Wiel | B81B 7/0038 438/48 |
| 2016/0282609 | A1* | 9/2016 | Hanaoka | G02B 26/0833 |
| 2017/0018476 | A1* | 1/2017 | Wang | H01L 23/49827 |
| 2022/0068856 | A1* | 3/2022 | Chiou | H01L 23/3135 |

* cited by examiner

METHODS AND APPARATUS FOR SEMICONDUCTOR PACKAGES WITH WINDOW ASSEMBLIES

RELATED APPLICATION

This patent claims the benefit of U.S. Provisional Patent Application No. 63/478,509, which was filed on Jan. 5, 2023. U.S. Provisional Patent Application No. 63/478,509 is hereby incorporated herein by reference in its entirety. Priority to U.S. Provisional Patent Application No. 63/478,509 is hereby claimed.

FIELD OF THE DISCLOSURE

This disclosure relates generally to semiconductor devices and, more particularly, to methods and apparatus to semiconductor packages with window assemblies.

BACKGROUND

Microelectromechanical systems (MEMS) include microscopic devices that often include moving parts controlled through electrical signals. A digital micromirror device (DMD) is a particular example of a MEMS device that may be utilized in many different technological applications including video projectors, television sets, digital cinema projectors, etc. DMDs include an array of micromirror assemblies each of which include a mirror that can be tilted or rotated to direct the reflection of light on the mirror surface. DMDs often include a window assembly positioned over the array of mirrors to allow light to reach the mirrors while protecting the mirrors during use.

Figure 1:
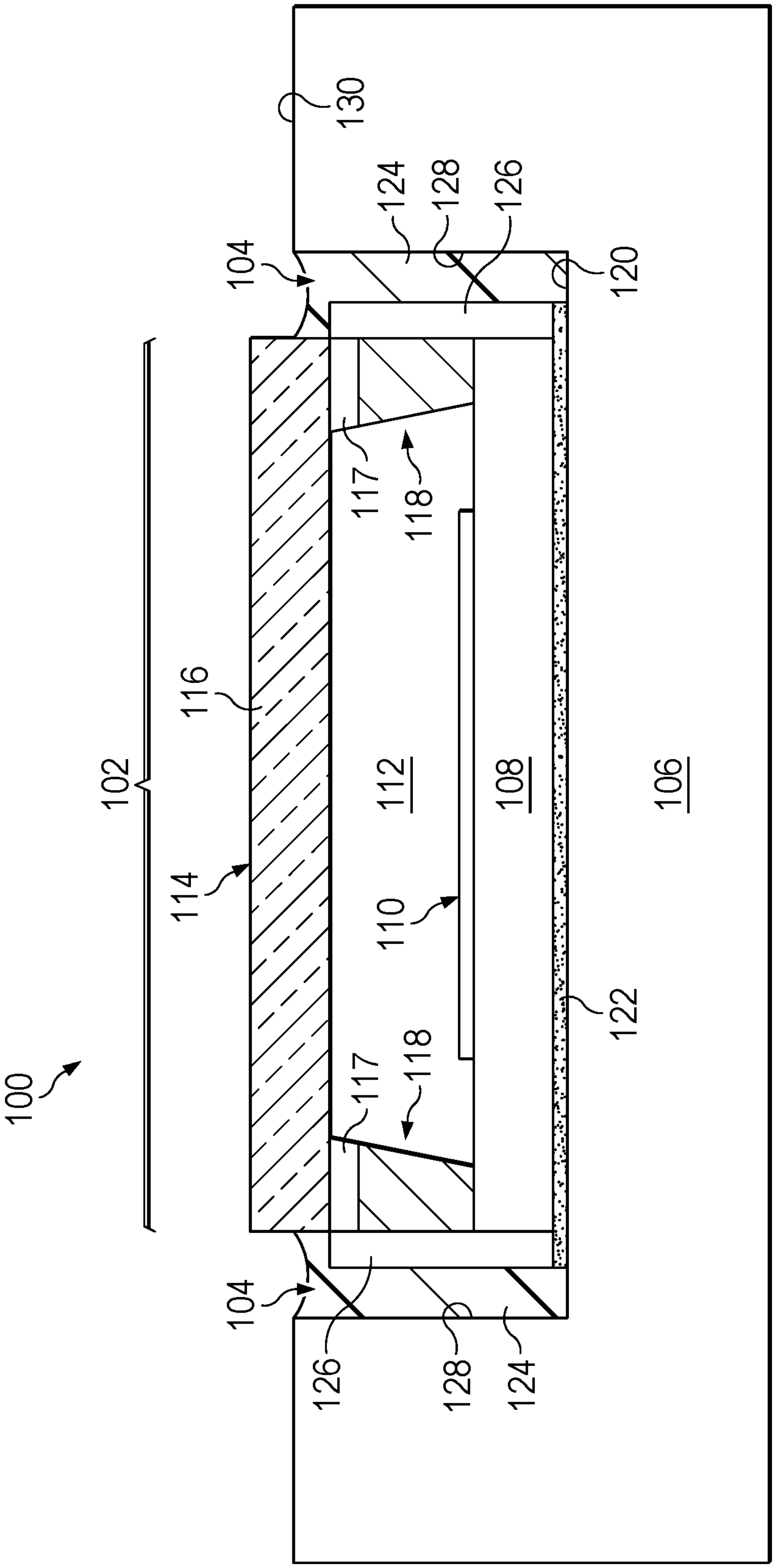
FIG. 1 illustrates an example packaged microelectromechanical system (MEMS) device in accordance with teachings disclosed herein.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of referencing a semiconductor device (e.g., a transistor), a semiconductor die containing a semiconductor device, and/or an integrated circuit (IC) package containing a semiconductor die during fabrication or manufacturing, "above" is not with reference to Earth, but instead is with reference to an underlying substrate on which relevant components are fabricated, assembled, mounted, supported, or otherwise provided. Thus, as used herein and unless otherwise stated or implied from the context, a first component within a semiconductor die (e.g., a transistor or other semiconductor device) is "above" a second component within the semiconductor die when the first component is farther away from a substrate (e.g., a semiconductor wafer) during fabrication/manufacturing than the second component is from the substrate on which the two components are fabricated or otherwise provided. Similarly, unless otherwise stated or implied from the context, a first component within an IC package (e.g., a semiconductor die) is "above" a second component within the IC package during fabrication when the first component is farther away from a printed circuit board (PCB) to which the IC package is to be mounted or attached. It is to be understood that semiconductor devices are often used in orientation different than their orientation during fabrication. Thus, when referring to a semiconductor device (e.g., a transistor), a semiconductor die containing a semiconductor device, and/or an integrated circuit (IC) package containing a semiconductor die during use, the definition of "above" in the preceding paragraph (i.e., the term "above" describes the relationship of two parts relative to Earth) will likely govern based on the usage context.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "programmable circuitry" is defined to include (i) one or more special purpose electrical circuits (e.g., an application specific circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations and/or functions, Field Programmable Gate Arrays (FPGAs) that may be programmed with second instructions to cause configuration and/or structuring of the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instructions to perform one or more operations and/or functions and/or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and/or any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

DETAILED DESCRIPTION

FIG. 1 illustrates an example microelectromechanical system (MEMS) device and package 100 in accordance with teachings disclosed herein. The example MEMS device and package 100 shown in the illustrated example can correspond to a digital micromirror device (DMD). However, teachings disclosed herein can be applied to other types of MEMS devices. The particular example MEMS device and package 100 shown in FIG. 1 is sometimes referred to as a cavity MEMS device (e.g., a cavity DMD) because a chip or chiplet 102 is disposed within a cavity 104 of a package substrate 106. In some examples, the package substrate 106 is a ceramic material. Accordingly, the package substrate 106 is sometimes also referred to as a ceramic substrate.

As shown in the illustrated example the chiplet 102 includes a semiconductor (e.g., silicon) substrate 108 on which is provided an array of MEMS elements 110, which may be an array of micromirrors. Each of the micromirrors is capable of tilting or rotating in a controlled manner. In some examples, the semiconductor substrate 108 also includes electrical components (e.g., transistors in an integrated circuit) that enable the control of the micromirrors. To protect the MEMS elements 110 during use, the MEMS elements 110 are housed within an open space 112 (e.g., a chamber) defined by a window assembly 114 mounted or attached to the semiconductor substrate 108 so as to extend over top of the MEMS elements 110. In some examples, the open space 112 is hermetically sealed from the external environment. As shown in FIG. 1, the window assembly 114 includes a transparent or translucent panel 116 (e.g., a pane, a window) with a semiconductor-based (e.g., silicon-based) interposer 117 positioned adjacent to the translucent panel 116 and attached to the semiconductor substrate 108 via a stack of bonding materials 118. In this example, the interposer 117 is attached to the translucent panel 116 adjacent to and/or along a perimeter or outer edge of the translucent panel 116. Similarly, as shown in the illustrated example, the stack of bonding materials 118 is positioned adjacent to and/or along the perimeter or outer edge of the translucent panel 116 (and adjacent the perimeter or outer edge of the semiconductor substrate 108). In some examples, the interposer 117 is omitted. In some examples, the translucent panel is composed of glass (e.g., a glass panel, a glass pane, a glass window). However, other translucent and/or transparent materials may also be used. The stack of bonding materials 118 is shown as a solid mass in FIG. 1 for the purposes of simplicity. However, the stack of bonding materials 118, as its name implies, can include multiple different layers of materials stacked in series between the semiconductor substrate 108 and the translucent panel 116. Different ones of the layers of materials in the stack of bonding materials 118 can include copper, nickel, gold, indium, titanium, nitrogen, aluminum, and/or any other suitable material(s).

As shown in FIG. 1, the chiplet 102 is positioned within the cavity 104 of the package substrate 106. More particularly, in this example, the chiplet 102 is mounted to a support surface 120 (e.g., a recessed surface) in the cavity 104 using a die attach epoxy 122. In the illustrated example, an encapsulant 124 substantially fills the space or volume within the cavity 104 that surrounds the chiplet 102 and helps to secure the chiplet 102 in place. In some examples, the encapsulant also serves to protect wire bonding interconnects (not shown in FIG. 1) that electrically couple the semiconductor substrate 108 to the package substrate 106.

The relatively narrow width of the stack of bonding materials 118 (as compared with the full width of the semiconductor substrate 108 and the translucent panel 116) results in the stack of bonding materials being a potential failure point in the MEMS device and package 100. That is, delamination or separation of different ones of the layers in the stack of bonding materials 118 can occur leading to a loss of the hermetic seal of the open space 112 and/or other damage to the MEMS device. At least one cause for such delamination has been found to be from stress caused by the addition of the encapsulant 124.

Accordingly, in the illustrated example of FIG. 1, an example buffer material 126 is provided between the stack of bonding materials 118 and the encapsulant 124. That is, the buffer material 126 separates the encapsulant 124 from the stack of bonding materials 118. The encapsulant, in turn, separates the buffer material 126 from a sidewall 128 of the cavity 104 extending between the recessed support surface 120 and an outer surface 130 of the package substrate 106. Thus, in some examples, the buffer material 126 is spaced apart from the sidewall 128 of the cavity 104.

In some examples, the buffer material 126 has a lower modulus of elasticity than the encapsulant 124. As a result, the buffer material 126 provides a buffer between the encapsulant 124 and the stack of bonding materials 118. Accordingly, the buffer material 126 absorbs stress that may be exerted by the encapsulant 124 to protect the stack of bonding materials 118. In some examples, the buffer material 126 is any suitable material with a modulus of elasticity of less than or equal to 5 Megapascal (MPa). One specific example of the buffer material 126 is silicone. In some examples, the buffer material 126 includes relatively low modulus organic materials. Examples of the encapsulant 124 include epoxies with a relatively low coefficient of thermal expansion (CTE) for relatively low packaging stress.

Figure 2:
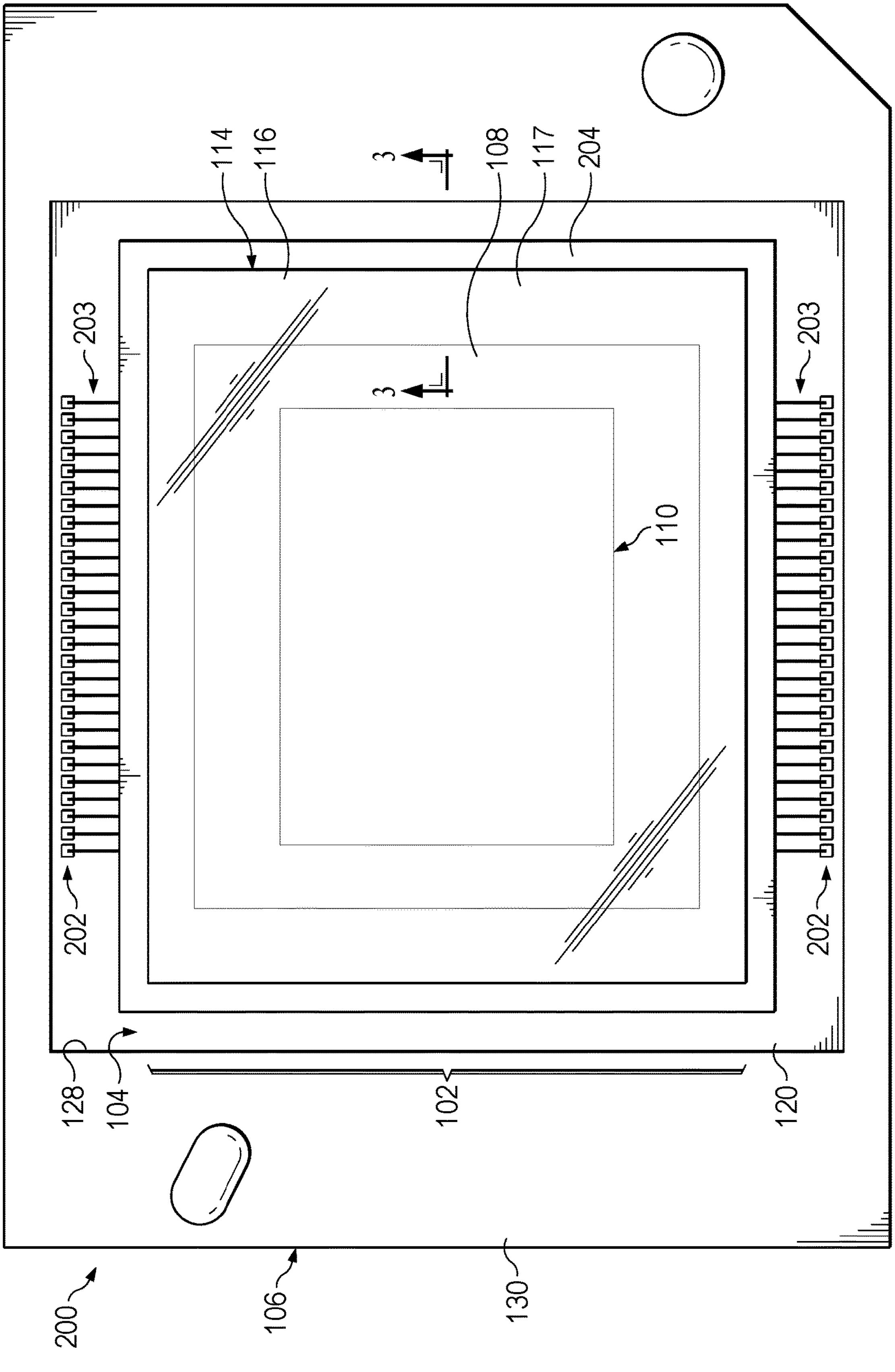
FIGS. 2-5 illustrate another example MEMS device and package in accordance with teachings disclosed herein.
Figure 3:
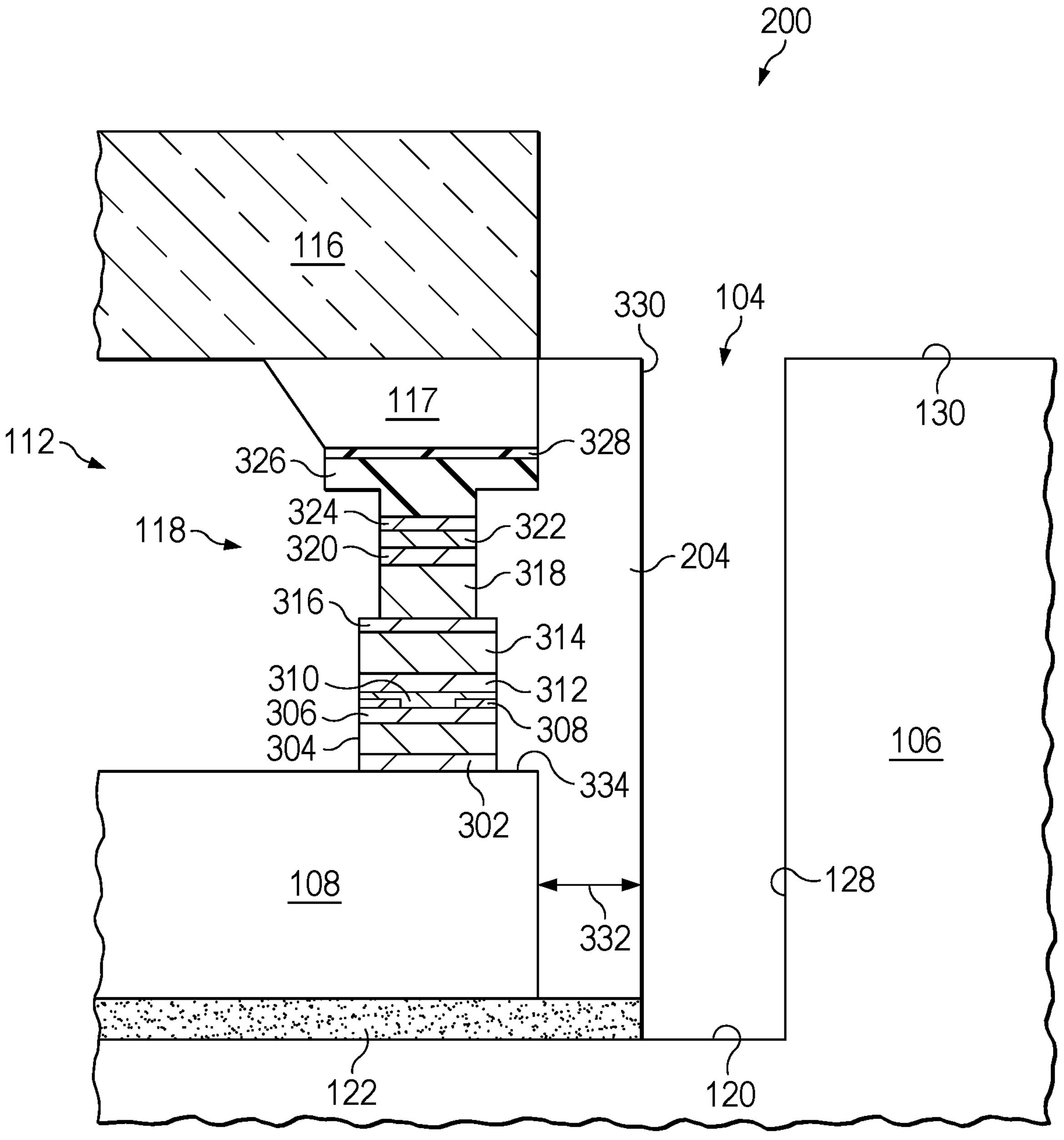
Figure 4:
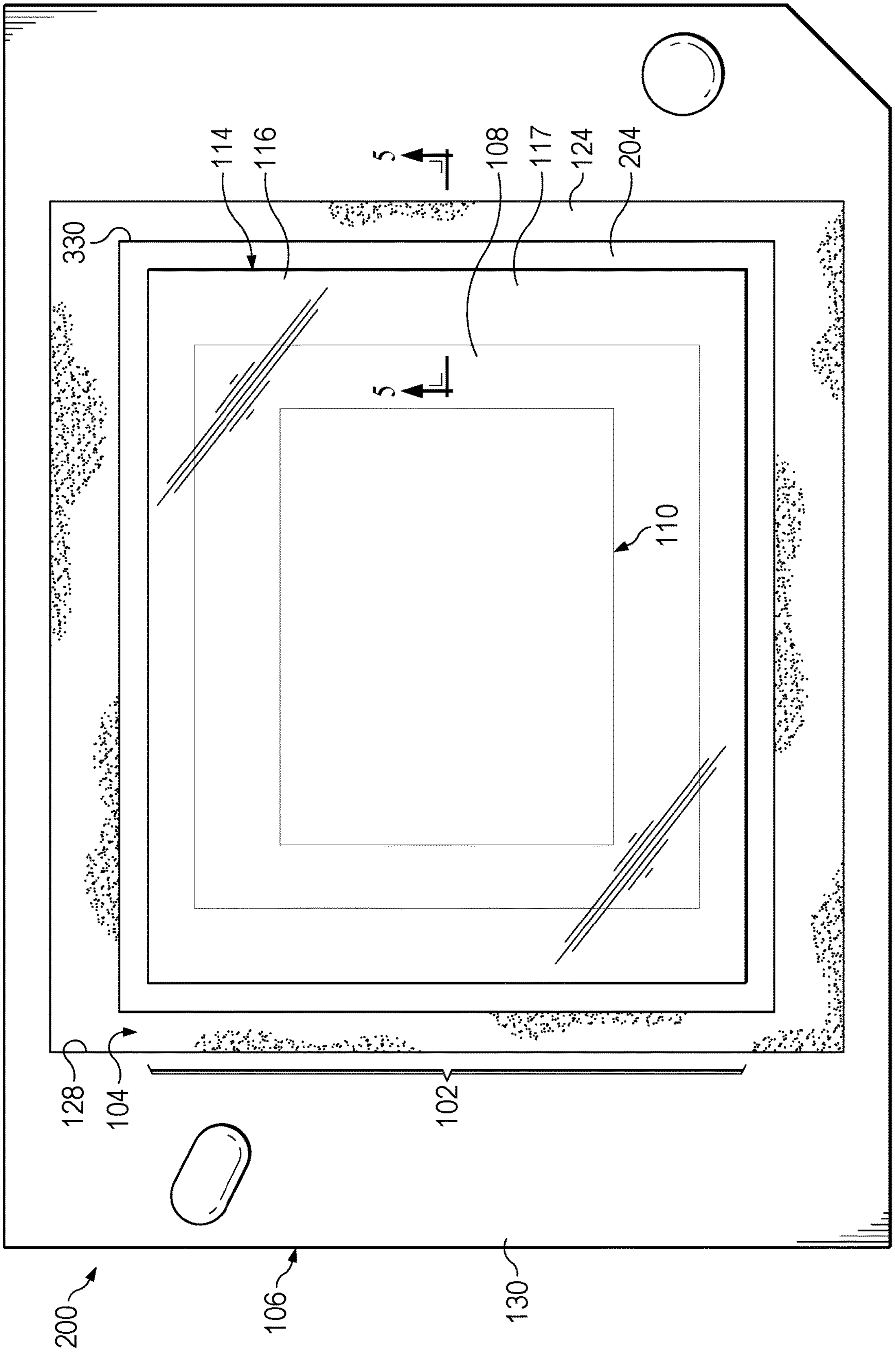
Figure 5:
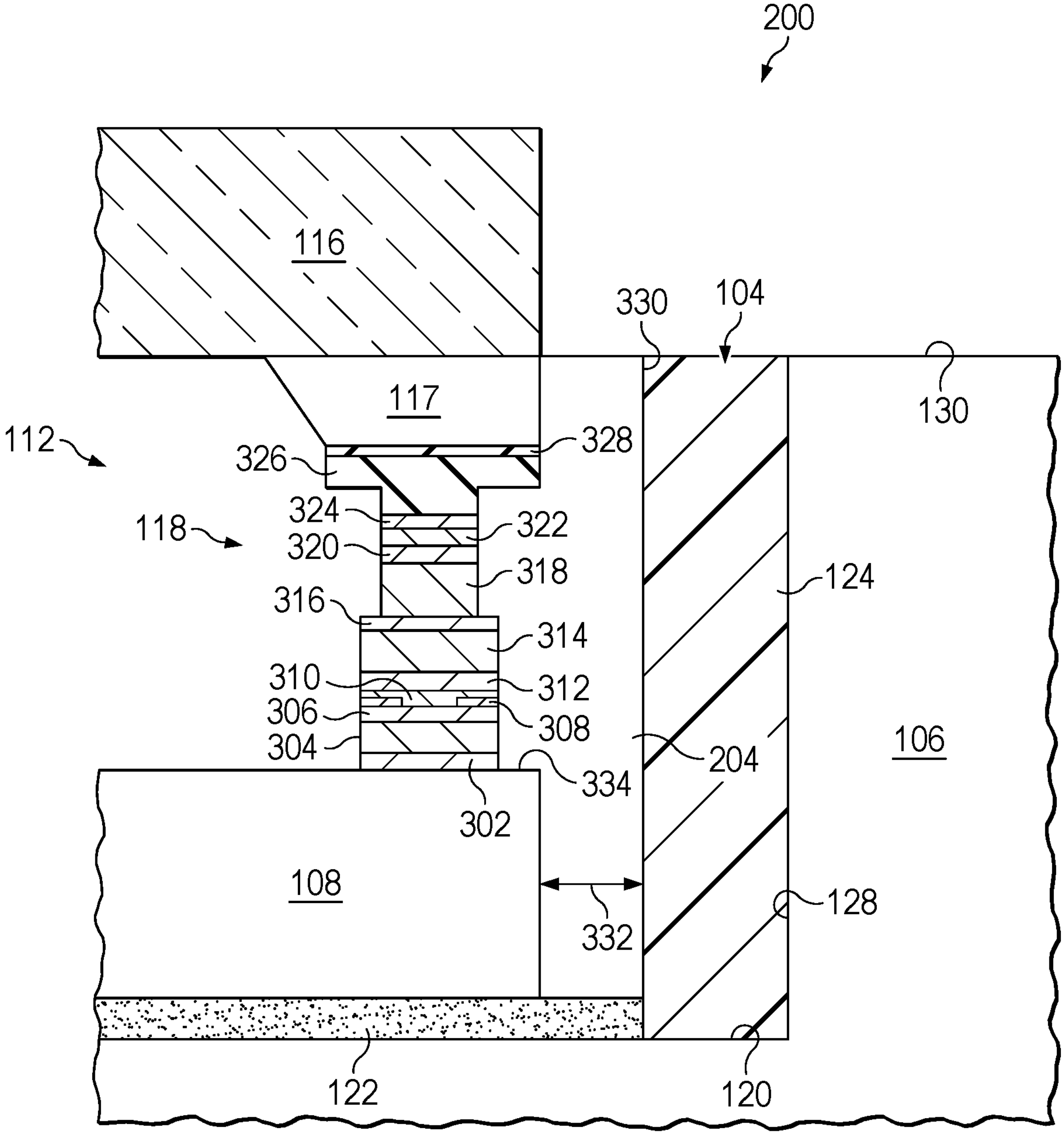

FIGS. 2-5 illustrate another example MEMS device and package 200 constructed in accordance with teachings disclosed herein. The example MEMS device and package 200 of FIGS. 2-4 is similar in construction to the example MEMS device and package 100 of FIG. 1. Accordingly, similar features are identified using the same reference numbers used in FIG. 1. FIG. 2 illustrates a top view of the example MEMS device and package 200 prior to the addition of the encapsulant 124. FIG. 3 is a cross-sectional view of a portion of the example MEMS device and package 200 taken along the line 3-3 shown in FIG. 2. FIG. 4 illustrates a top view of the example MEMS device and package 200 after the addition of the encapsulant 124. FIG. 5 is a cross-sectional view of a portion of a package of the example MEMS device and package 200 taken along the line 5-5 shown in FIG. 4. While only a portion of the MEMS device and package 200 is shown in FIGS. 3 and 5 corresponding to one side of the MEMS device and package 200, it should be understood that the other side of the device and package will be symmetrical to what is shown.

As discussed above in connection with FIG. 1, the chiplet 102 shown in FIGS. 2-5 is disposed within a cavity 104 of the package substrate 106. In some examples, the chiplet 102 is initially secured in place using a die attach epoxy, which is not shown in FIGS. 2-5 for purposes of simplicity. In some examples, as shown in FIG. 2, the cavity 104 also contains wire bonding pads 202 adjacent one or more sides of the chiplet 102. In this example, the wire bonding pads 202 (on the package substrate 106) are electrically connected, by wire bonds 203, to the semiconductor substrate 108 that supports MEMS elements 110. The MEMS elements 110 are covered by the translucent panel 116. The translucent panel 116 is not shown in FIG. 2 (except by surface shading) because of its transparency. However, the perimeter or outer edge of the translucent panel 116 is demarcated in FIG. 2 by the example buffer material 204 that lines the perimeter or outer edge of the translucent panel 116 (as well as the outer surface or lateral side of the underlying interposer 117, as shown in FIGS. 3 and 5). In some examples, the buffer material 204 also extends along a perimeter or outer edge of the semiconductor substrate 108. Thus, as shown in FIGS. 2 and 4, the buffer material 204 extends completely and/or continuously around the outer sides of the chiplet 102. In other words, the buffer material 204 surrounds and/or encloses the stack of bonding materials 118, which in turn, surround and/or enclose the MEMS elements 110. In some examples, the buffer material 204 extends to the same height as the encapsulant 124 so as to be exposed to an external environment adjacent the encapsulant 124 as shown in FIGS. 4 and 5. In other examples, as represented in FIG. 1, the buffer material 204 is enclosed by and/or encased within the encapsulant 124. In other examples, the buffer material 204 extends beyond the top surface of the encapsulant 124 (e.g., up some or all of the outer edge of the translucent panel 116).

Unlike the simplified example of FIG. 1, different layers of materials in the stack of bonding materials 118 are represented in FIGS. 3 and 5. Specifically, in this example, the stack of bonding materials 118 includes a layer 302 of titanium nitride, a layer 304 of an aluminum-copper alloy, another layer 306 of titanium nitride, an arc oxide 308, a layer 310 of titanium, a layer 312 of copper, a layer 314 of nickel, a layer 316 of a gold, a layer 318 of indium (in some examples, the gold and indium layers 316, 318 are combined into an indium-gold alloy), another layer 320 of nickel, another layer of copper 322, another layer 324 of titanium, a plasma-enhanced chemical vapor deposition (PECVD) oxide 326, and a thermal oxide 328. In some examples, different materials can be used for different ones of the layers in the stack of bonding materials 118. In some examples, one or more of the layers shown in FIGS. 3 and 5 can be omitted and/or replaced by a different material. In some examples, the order and/or arrangement of the layers may differ from what is shown in the illustrated example. In some examples, additional layers of materials may be included. In some examples, the layers may have different thicknesses from what is represented in the figures.

In some examples, some of the layers in the stack of bonding materials 118 have different functions and/or purposes other than merely providing a bond between the semiconductor substrate 108 and the translucent panel 116. In some examples, as shown in FIGS. 3 and 5, the buffer material 204 is in contact with multiple, if not all, of the layers in the stack of bonding materials 118 (as well as the interposer 117) extending between the semiconductor substrate 108 and the translucent panel 116. That is, in some examples, the buffer material 204 extends a full distance between the translucent panel 116 and the semiconductor substrate 108. In some examples, the buffer material 204 is in contact with less than all of the layers in the stack of bonding materials 118 extending between the semiconductor substrate 108 and the translucent panel 116. As shown in the illustrated example, the buffer material 204 is on a side of the layers of the bonding materials 118 opposite the open space 112 containing the MEMS elements 110 (not pictured in FIGS. 3 and 5 but pictured in FIG. 1). In some examples, the buffer material 204 also extends some or all of the way along the outer edge of the semiconductor substrate 108 and/or the translucent panel 116. In some examples, the buffer material 204 is limited to being in contact with the layers of the stack of bonding materials 118 and spaced apart from one or both of the semiconductor substrate 108 and the translucent panel 116.

As represented in the cross-sectional views of FIGS. 3 and 5, in some examples, different layers in the stack of bonding materials 118 have different widths to define a shape profile for the stack of bonding materials 118 that is non-linear (e.g., is non-planar, is irregular, and/or includes one or more steps). In the illustrated example, the buffer material 204 conforms to the shape profile of the stack of bonding materials 118. However, in this example, the shape of an outer surface 330 of the buffer material 204 is different than the shape profile of the side of the layers in the stack of bonding materials 118. That is, a thickness 332 of the buffer material 204 measured in a direction extending laterally away from the side of the stack of bonding materials 118 and the semiconductor substrate 108 (e.g., a direction parallel to the semiconductor substrate 108 and/or parallel to the translucent panel 116) varies across the height of the buffer material 204 (as measured in a direct extending from the semiconductor substrate 108 towards the translucent panel 116). In some examples, the thickness 332 of the buffer material 204 can vary from less than 1 micron (e.g., 0.1 micron) at some locations to several millimeters or more at other locations. In this example, the shape of the outer surface 330 of the buffer material 204 is linear (e.g., planar) and approximately parallel to the sidewall 128 of the cavity 104. However, the outer surface 330 of the buffer material 204 may have any other suitable shape (e.g., rounded, irregular, slanted relative to the sidewall 128, etc.). In some examples, the thickness 332 of the buffer material 204 and the resulting shape of the outer surface 330 is controlled based on the method of application of buffer material 204. Specifically, in this example, the buffer material 204 is applied through a dispenser. In such examples, the material used for the buffer material 204 is selected based on the ability to apply the buffer material 204 through a dispenser (e.g., a nozzle). For instance, in some such examples, the buffer material 204 is silicone. However, other materials may additionally or alternatively be used.

In some examples, as shown in FIGS. 3 and 5, the stack of bonding materials 118 are inset relative to at least some portion(s) of the outer edge or perimeter of the semiconductor substrate 108 to expose a protruding upper surface 334 of the semiconductor substrate 108. In some examples, the protruding upper surface 334 includes contact pads to enable the electrical coupling of the semiconductor substrate 108 to the package substrate 106 using wire bonds 203. In the illustrated example, the wire bonds 203 extend through the buffer material 204 to reach the protruding upper surface 334. In other examples, the protruding upper surface 334 extends beyond the buffer material 204 (at least in regions associated with the wire bonds 203) so that the buffer material 204 is spaced apart from the wire bonds 203. The wire bonds 203 are not shown in FIGS. 3 and 5, but a cross-sectional view of example wire bonds that may be implemented for the wire bonds 203 of FIG. 2 are shown in FIGS. 8 and 9 discussed further below.

Figure 6:
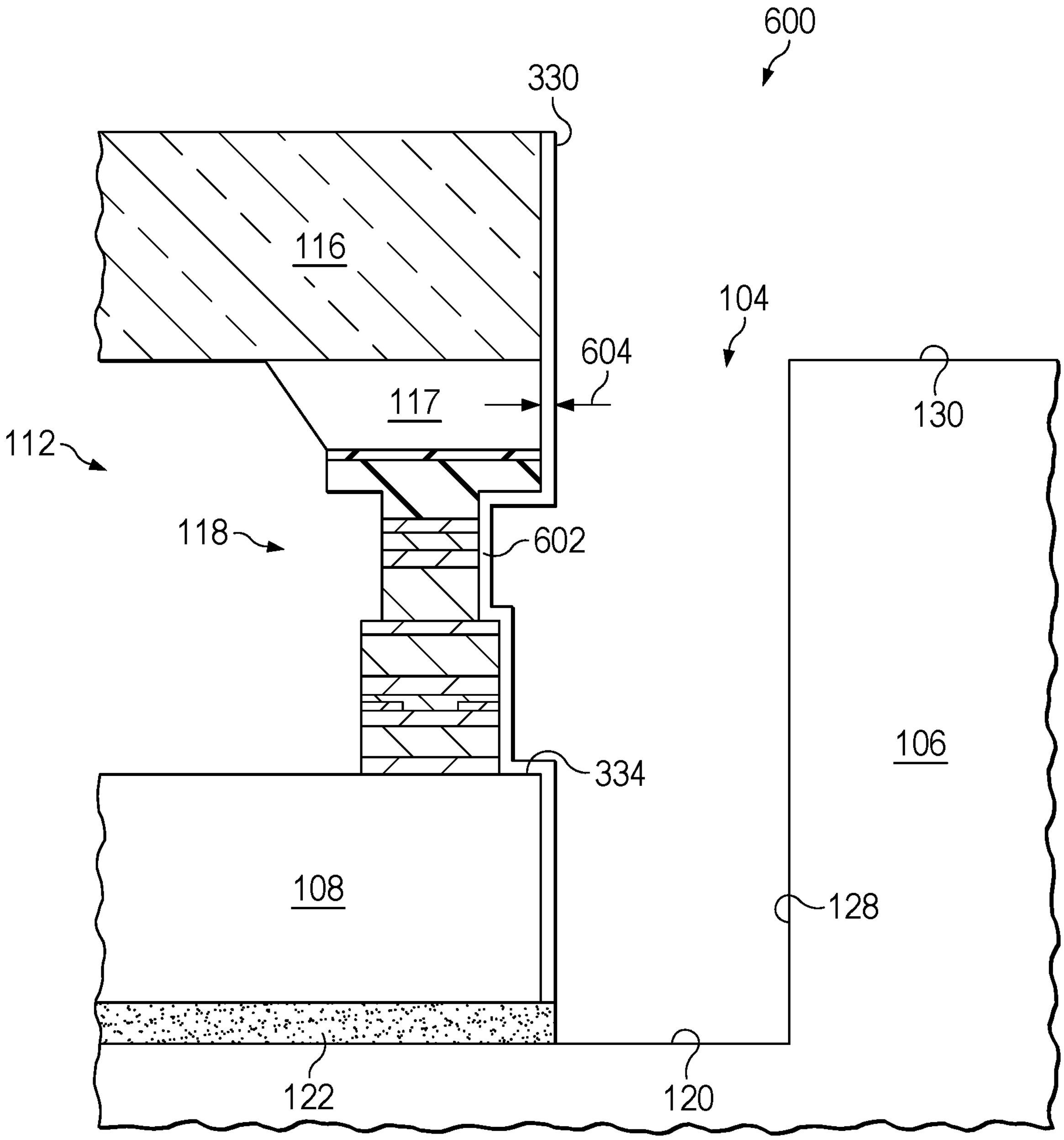
FIGS. 6 and 7 illustrate an example MEMS device and package in accordance with teachings disclosed herein.
Figure 7:
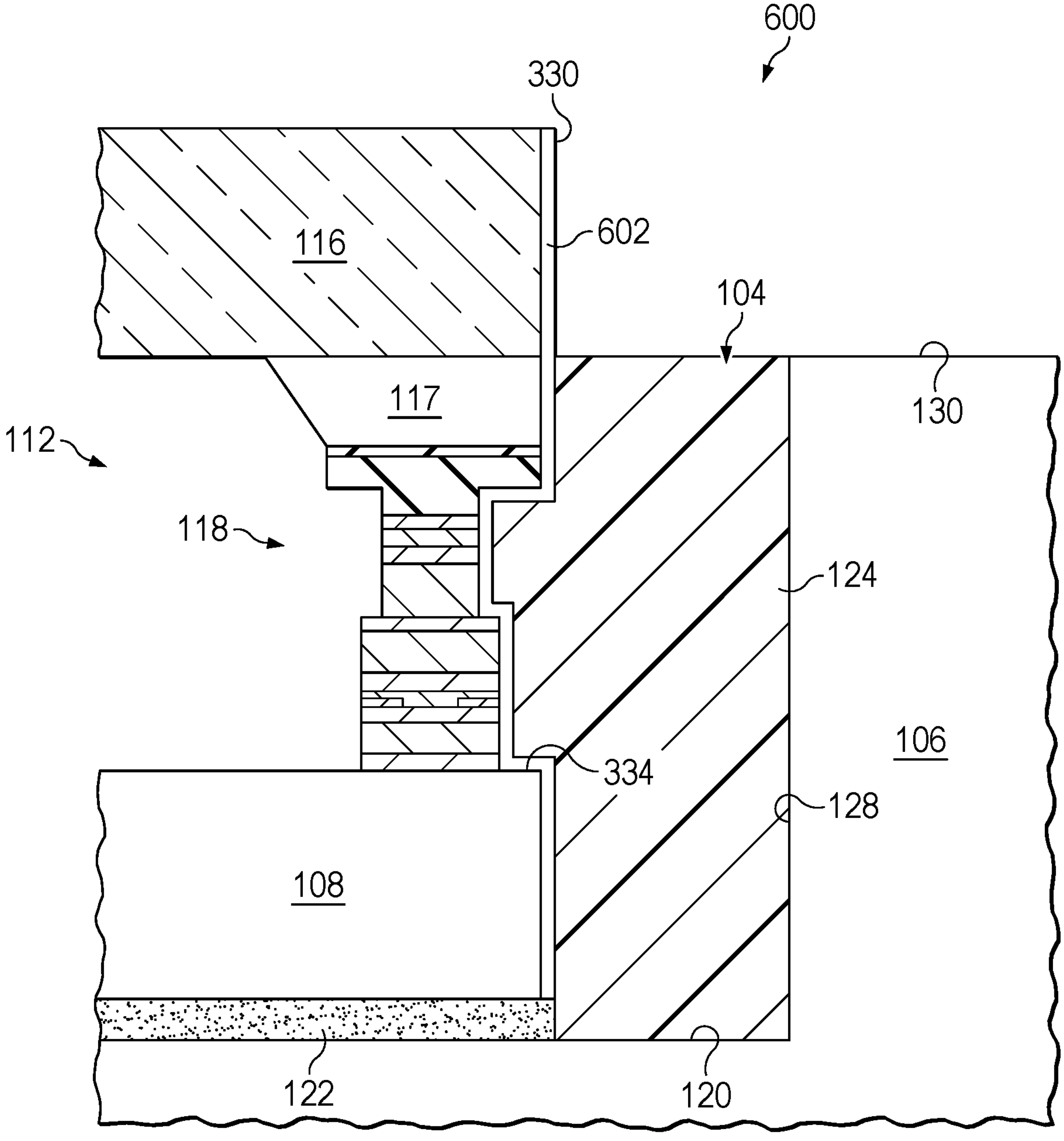

FIG. 6 is a cross-sectional view of another example MEMS device and package 600 prior to the addition of encapsulant. FIG. 7 is a cross-sectional view of the example MEMS device and package 600 of FIG. 6 after the addition of encapsulant. The example MEMS device and package 600 of FIGS. 6 and 7 is similar to the example MEMS device and package 200 of FIGS. 2-4. Accordingly, similar features are identified using the same reference numbers and the discussion of such features provided above applies equally to the example DMD of FIGS. 6 and 7. For purposes of clarity, Unlike the example MEMS device and package 200 of FIGS. 2-5 that includes a buffer material 204 applied through a dispenser to control and/or vary the thickness 332 of the buffer material 204 at different locations, the example MEMS device and package 600 of FIGS. 6 and 7 includes a thin film buffer material 602 that conformally coats the outer lateral side of the stack of bonding materials 118. Thus, in this example, the shape of an outer surface 330 of the buffer material 204 corresponds to the shape profile of the side of the layers in the stack of bonding materials 118. That is, the buffer material 602 shown in FIGS. 6 and 7 has a substantially consistent thickness 604 at all locations. In some examples, the thickness 604 of the buffer material 602 is less than 1 micron (e.g., less than 0.5 microns, less than 0.2 microns, less than 0.1 micron, etc.). In some examples, the thin film buffer material 602 is applied using a vapor deposition process (e.g., atomic layer deposition (ALD), physical vapor deposition (PVD), chemical vapor deposition (CVD), etc.). Example materials for the thin film buffer material 602 include any suitable organic film with a relatively low modulus of elasticity (e.g., a modulus of less than or equal to 5 MPa).

Inasmuch as the buffer material 602 in FIGS. 6 and 7 is thinner than the buffer material 204 in FIGS. 2-5, the example MEMS device and package 600 shown in FIGS. 6 and 7 includes additional encapsulant 124 to fill the additional space or volume adjacent the thin film coating of the buffer material 602 within the cavity 104 of the package substrate 106. In the illustrated example of FIG. 7, the buffer material 602 extends beyond the top surface of the encapsulant 124 (e.g., farther away from the support surface 120 than the encapsulant 124 extends from the support surface 120). However, in other examples, the buffer material 602 may be approximately level with the top surface of the encapsulant 124 (similar to FIG. 5) or below the top surface of the encapsulant 124 (similar to FIG. 1).

Figure 8:
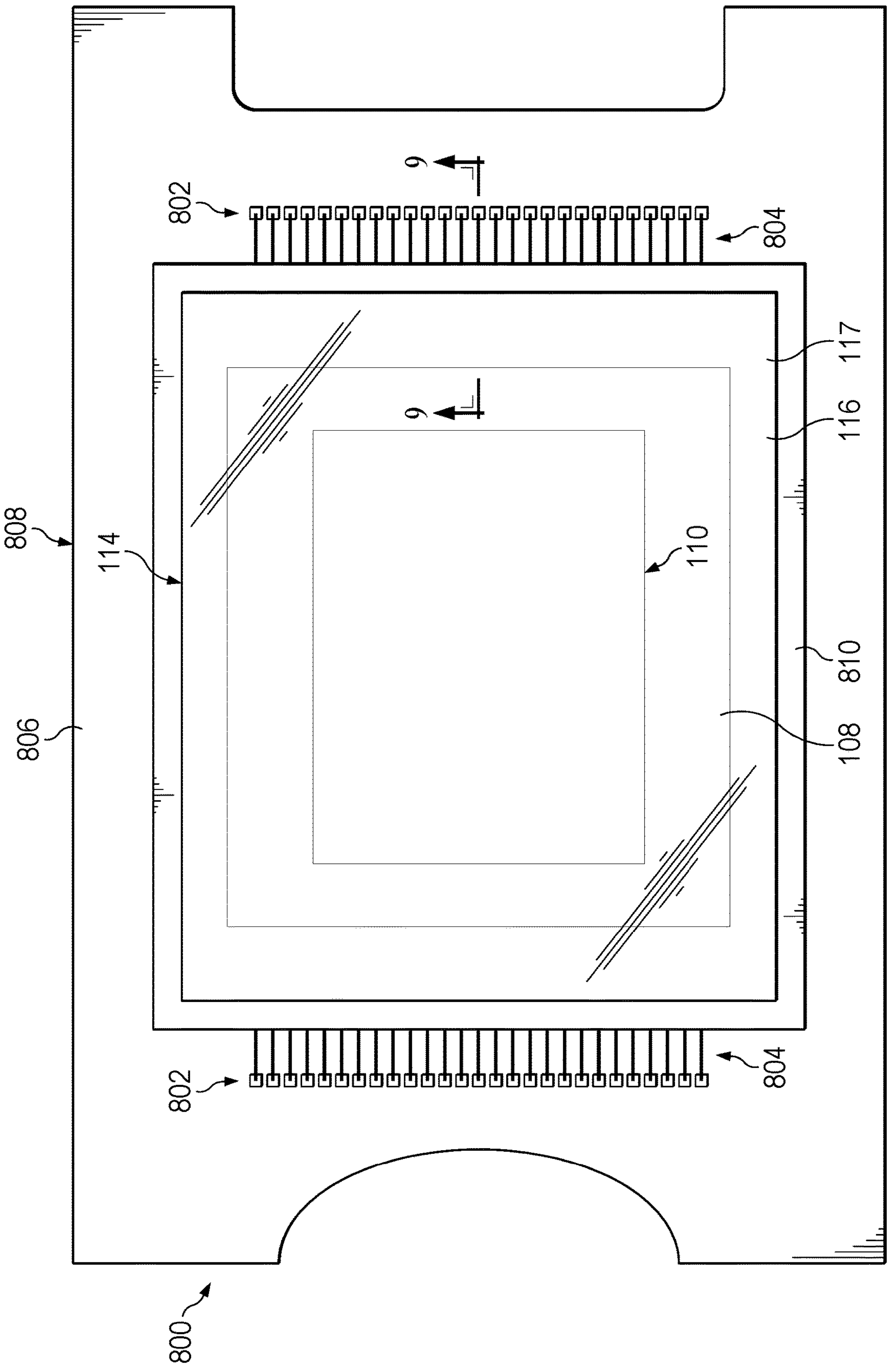
FIGS. 8 and 9 illustrate another example MEMS device and package in accordance with teachings disclosed herein.
Figure 9:
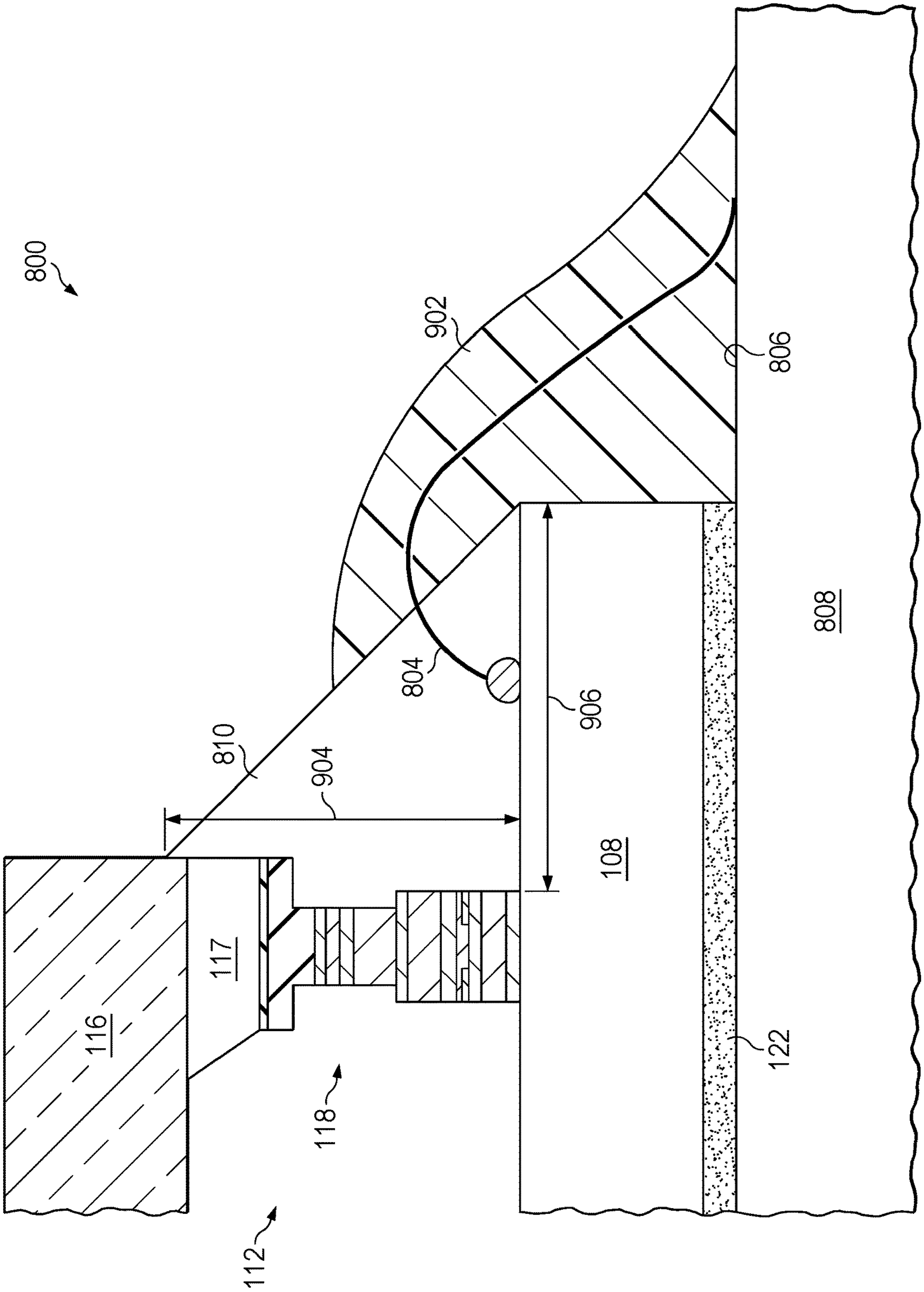

FIGS. 8 and 9 illustrate another example MEMS device and package 800 constructed in accordance with teachings disclosed herein. FIG. 8 illustrates a top view of the example MEMS device and package 800 prior to the addition of an encapsulant 812. FIG. 9 is a cross-sectional view of a portion of a package of the example MEMS device package 800 taken along the line 9-9 shown in FIG. 8 after the addition of the encapsulant 812. Features and components in the example MEMS device and package 800 of FIGS. 8 and 9 that are similar to the components of the other example MEMS devices and packages 100, 200, 600 are identified by the same reference numbers. Further, the description of such features and components applies equally to the example MEMS device and package 800 of FIG. 8 except as otherwise provided herein. Thus, as shown in the illustrated example of FIGS. 8 and 9, the MEMS device and package 800 includes a translucent panel 116 attached to a semiconductor substrate 108 via a stack of bonding materials 118 to define an open space or chamber 112. The stack of bonding materials 118 may have any suitable number of layers of materials in any suitable arrangement and/or shape as described above in connection with the detailed example of the stack of bonding materials 118 shown in FIGS. 3, 5, 6, and 7.

Unlike the example MEMS devices and packages 100, 200, 600 of FIGS. 1-7, which are sometimes referred to as cavity MEMS devices (e.g., a cavity DMD) because the chiplet 102 is disposed within a cavity 104, the example MEMS device and package 800 of FIGS. 8 and 9 is mounted to a support surface 806 of a flat package substrate 808 (e.g., ceramic substrate). In this example, the semiconductor substrate 108 is attached to the package substrate via a die attach epoxy 122. As shown in the illustrated example, the support surface 806 corresponds to an upper surface of the package substrate 808 rather than being within a cavity recessed relative to the upper surface. Such MEMS devices and packages are sometimes referred to as panel MEMS (e.g., panel DMDs). As shown in FIG. 8, the package substrate 808 includes wiring bonding pads 802 adjacent to one or more sides of the semiconductor substrate 108. In this example, the wire bonding pads 202 (on the package substrate 808) are electrically connected, by wire bonds 804, to the semiconductor substrate 108 that supports MEMS elements 110.

In the illustrated example of FIGS. 8 and 9, a buffer material 810 is positioned against the stack of bonding materials 118 to separate the stack of bonding materials 118 from an encapsulant 812 used to surround the semiconductor substrate 108 and to encapsulate the wire bonds 804. In this example, at least a portion of the wire bonds 804 are encapsulated by the buffer material 810. In this example, the buffer material 810 has a generally triangular cross-sectional shape (e.g., like a fillet) with any suitable height 904 (e.g., less than 1 micron (e.g., 0.1 micron) and up to several millimeters or more) and any suitable width 906 (e.g., less than 1 micron (e.g., 0.1 micron) and up to several millimeters or more). However, the buffer material 810 can have any suitable shape with any suitable thickness that may be controlled by applying the buffer material with a dispenser. In the illustrated example, the width 906 corresponds to an extent the semiconductor substrate 108 extends beyond the stack of bonding materials 118. That is, in this example, the buffer material 810 extends up to but not beyond or over the outer perimeter or edge of the semiconductor substrate 108. In other examples, the buffer material 810 can extend beyond and/or over the outer perimeter or edge of the semiconductor substrate 108. In other examples, the width 906 is less than the extent the semiconductor substrate 108 extends beyond the stack of bonding materials 118. An example material for the buffer material 810 is silicone. In some examples, the encapsulant 812 is implemented by a glob-top epoxy (with a higher thixotropic index that epoxies used for the encapsulant 124 in FIGS. 1-7) because there is no cavity to retain the encapsulant and prevent it from flowing away prior to being cured. As shown in the illustrated example, the buffer material 810 extends around and/or along the perimeter of the semiconductor substrate 108 and the stack of bonding materials 118.

Figure 10:
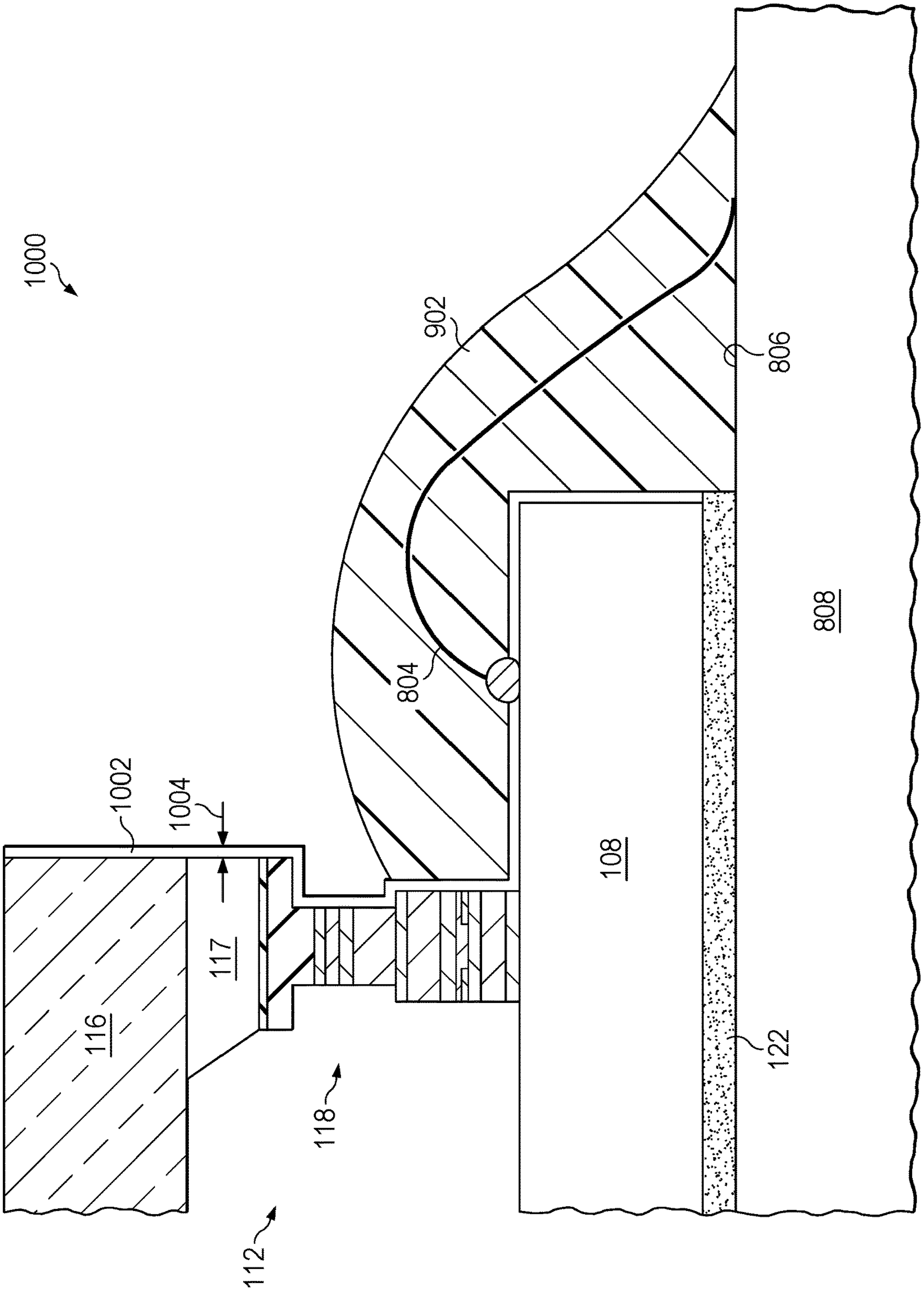
FIG. 10 is a cross-sectional view of another example MEMS device and package in accordance with teachings disclosed herein.

FIG. 10 is a cross-sectional view of another example MEMS device and package 1000 constructed in accordance with teachings disclosed herein. The example MEMS device and package 1000 of FIG. 10 is similar to the example MEMS device and package 800 of FIGS. 8 and 9. Accordingly, similar features are identified using the same reference numbers and the discussion of such features provided above applies equally to the example MEMS device and package 1000 of FIG. 10. Unlike the example MEMS device and package 800 of FIGS. 8 and 9 that has a relatively thick buffer material 810 applied through a dispenser, the example MEMS device and package 1000 of FIG. 10 includes a thin film buffer material 1002 that conformally coats the outer lateral side of the stack of bonding materials 118 (as well as the outer surfaces of the semiconductor substrate 108 and the translucent panel 116). As discussed above in connection with FIGS. 6 and 7, in some examples, the thin film buffer material 1002 is achieved through a vapor deposition process (e.g., ALD, PVD, CVD, etc.) to have a relatively consistent thickness 1004 that is less than 1 micron.

The foregoing examples of the MEMS devices and packages 100, 200, 600, 800, 1000 teach or suggest different features. Although each example MEMS device and package 100, 200, 600, 800, 1000 disclosed above has certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features. Further, while the examples disclosed herein are described with reference to DMDs, teachings disclosed herein may be applied to any suitable apparatus that includes window assemblies in which a translucent panel (or any other material) is attached to an underlying substrate via a stack of bonding materials that pose a risk of delamination when directly in contact with an encapsulant.

Figure 11:
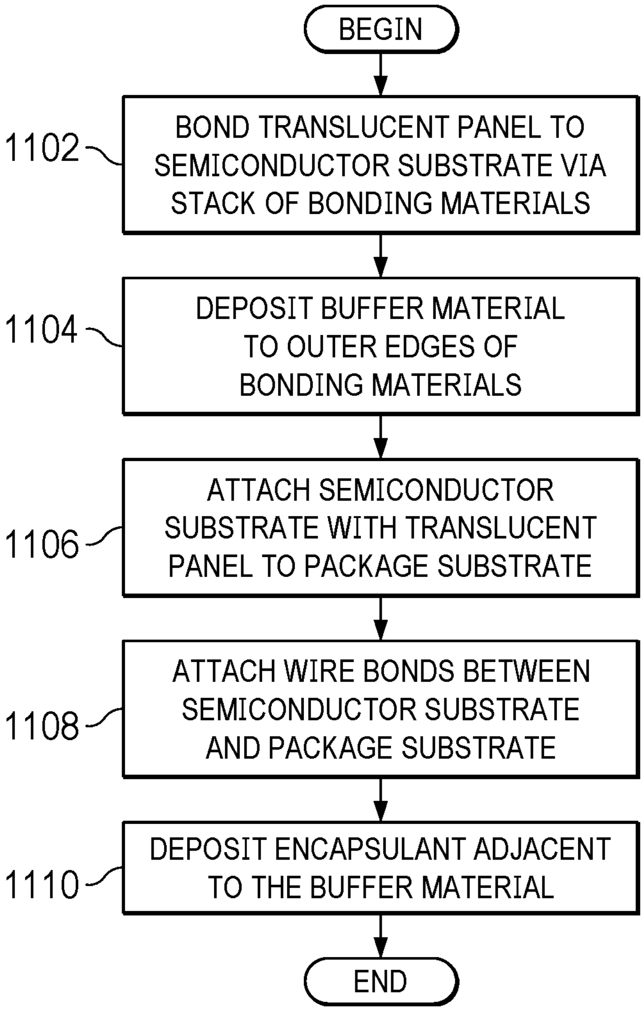
FIG. 11 is a flowchart illustrating an example method of manufacturing any one of the example MEMS devices and packages of FIGS. 1-10.

FIG. 11 is a flowchart illustrating an example method of manufacturing any one of the example MEMS devices and packages 100, 200, 600, 800, 1000 of FIGS. 1-10. In some examples, some or all of the operations outlined in the example method are performed automatically by fabrication equipment that is programmed to perform the operations. Although the example method of manufacture is described with reference to the flowchart illustrated in FIG. 11, many other methods may alternatively be used. For example, the order of execution of the blocks may be changed, and/or some of the blocks described may be combined, divided, re-arranged, omitted, eliminated, and/or implemented in any other way.

The example process of FIG. 11 begins at block 1102 by bonding a translucent panel 116 to a semiconductor substrate 108 via a stack of bonding materials 118. More particularly, in some examples, different portions of the stack of bonding materials 118 are added in series onto each of the translucent panel 116 and the semiconductor substrate 108. Specifically, in some examples, after attaching the interposer 117 to the translucent panel, each of the layers 320-328 (identified in FIG. 2) are added to the interposer 117. Independent of (e.g., in parallel with) such operations, each of the layer 302-314 are added to the semiconductor substrate 108. Thus, both portions of the stack of materials 118 up to the adjacent layers 314, 320 of nickel are provided. Once these layers have been provided on the respective translucent panel 116 and the semiconductor substrate 108, the two assemblies are bonded together by the layers 316, 318 of gold and indium (and/or a gold-indium alloy). In some examples, the bonding of the translucent panel 116 to the semiconductor substrate 108 is performed at the wafer level. In such examples, the wafer is subsequently cut or singulated to define individual chiplets 102 that can then be picked and placed onto a corresponding package substrate 106, 808.

At block 1104, the example process includes depositing a buffer material 126, 602, 810, 1002 to outer edges of the bonding materials 118. In some examples, the buffer material 126, 602, 810, 1002 is additionally applied to outer edges of one or more of the semiconductor substrate 108, the interposer 117, and/or the translucent panel 116. In some examples, such as those shown in FIGS. 2-5, 8, and 9, deposition of the buffer material 126, 602, 810, 1002 is accomplished using a buffer material dispenser (e.g., a nozzle dispenser). An advantage of using a dispenser is that the thickness and resulting shape of the buffer material 126, 602, 810, 1002 can be controlled with different thickness at different locations on the same MEMS device and package 100, 200, 600, 800, 1000. However, such dispensing of the buffer material 126, 602, 810, 1002 is typically performed on each chiplet 102 individually (e.g., after singulation) and, therefore, can be a relatively slow process. In other examples, such as those shown in FIGS. 6, 7, and 10, deposition of the buffer material 126 is accomplished through vapor deposition. An advantage of vapor deposition is that this can be performed at the wafer level (e.g., prior to singulation) for a much faster process. However, using vapor deposition limits the thickness of the buffer material 126, 602, 810, 1002 to be consistent at all locations where it is deposited (e.g., all exposed portions of the assembly). Further, vapor deposition may include additional operations before and/or after the deposition to add protective layers where the buffer material is not to be deposited (e.g., across the top surface of the translucent panel) and/or then to remove the protective layers after the fact. In some examples, block 1004 can be implemented later in the process as discussed further below.

At block 1106, the example process includes attaching the semiconductor substrate 108 with the translucent panel 116 to a package substrate 106, 808. In some examples, the depositing of the buffer material 126, 602, 810, 1002 is implemented after the semiconductor substrate 108 is attached to the package substrate 106, 808. At block 1108, the example process includes attaching wire bonds (e.g., the wire bonds 804 shown in FIGS. 8-10) between the semiconductor substrate 108 and the package substrate 106. In examples, where the buffer material 126, 602, 810, 1002 has already been added, some of the buffer material 126, 602, 810, 1002 may be removed to enable the attachment of the wire bonds. In some examples, the depositing of the buffer material 126, 602, 810, 1002 is implemented after the wire bonds are attached. At block 1110, the example process includes depositing encapsulant 124, 812 adjacent to the buffer material 126, 602, 810, 1002. In some examples, the encapsulant 124, 812 is deposited using a nozzle dispenser. The buffer material 126, 602, 810, 1002 serves as a buffer between the encapsulant 124, 902 and the stack of bonding materials 118 to reduce stress on the bonding materials 118 and, as a result, reduce delamination of the layers within the stack of bonding materials 118. After the deposition of the encapsulant 124, 812, the example process of FIG. 11 ends.

The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

Further examples and combinations thereof include the following:

Example 1 includes an apparatus comprising a translucent panel, a semiconductor substrate, a stack of bonding materials between the translucent panel and the semiconductor substrate, and a buffer material extending along a lateral side of the stack of bonding materials.

Example 2 includes the apparatus of example 1, further comprising an encapsulant, the buffer material between the stack of bonding materials and the encapsulant.

Example 3 includes the apparatus of example 2, wherein the buffer material has a lower modulus of elasticity than the encapsulant.

Example 4 includes the apparatus of example 2, wherein the semiconductor substrate is mounted to a support surface, the buffer material extending farther away from the support surface than the encapsulant extends away from the support surface.

Example 5 includes the apparatus of example 1, wherein the buffer material extends between the translucent panel and the semiconductor substrate along the lateral side of the stack of bonding materials.

Example 6 includes the apparatus of example 1, wherein the buffer material is a thin film coating on the lateral side of the stack of bonding materials.

Example 7 includes the apparatus of example 1, wherein the buffer material comprises silicone.

Example 8 includes the apparatus of example 1, wherein the buffer material extends along a perimeter of at least one of the translucent panel or the semiconductor substrate.

Example 9 includes the apparatus of example 1, wherein the buffer material surrounds the stack of bonding materials.

Example 10 includes the apparatus of example 1, further comprising a package substrate, the semiconductor substrate attached to the package substrate.

Example 11 includes the apparatus of example 10, wherein the package substrate includes a cavity defined by a first surface that is recessed relative to a second surface, the semiconductor substrate attached to the first surface.

Example 12 includes the apparatus of example 11, wherein the cavity is defined by a sidewall extending between the first surface and the second surface, the buffer material to be spaced apart from the sidewall.

Example 13 includes a digital micromirror device comprising a semiconductor substrate supporting an array of micromirrors, a window spaced apart from the array of micromirrors, layers of bonding materials coupling the window to the semiconductor substrate, the layers of bonding materials stacked adjacent a perimeter of the semiconductor substrate and the window to at least partially enclose an open space between the array of micromirrors and the window, and a buffer material in contact with multiple ones of the layers of bonding materials, the buffer material on a side of the layers of bonding materials opposite the open space.

Example 14 includes the digital micromirror device of example 13, further comprising an encapsulant surrounding the layers of bonding materials, the buffer material separating the encapsulant from the layers of bonding materials.

Example 15 includes the digital micromirror device of example 14, wherein the semiconductor substrate is disposed in a cavity of a ceramic substrate, the encapsulant filling a volume of the cavity surrounding the buffer material.

Example 16 includes the digital micromirror device of example 13, wherein a shape of an outer surface of the buffer material corresponds to a shape profile of the side of the layers of bonding materials opposite the open space.

Example 17 includes the digital micromirror device of example 13, wherein a shape of an outer surface of the buffer material is different than a shape profile of the side of the layers of materials opposite the open space.

Example 18 includes a method comprising bonding, via a plurality of layers of bonding materials, a translucent panel to a semiconductor substrate, the translucent panel to extend across an array of micromirrors on the semiconductor substrate, and depositing a buffer material to outer edges of the layers of the bonding materials.

Example 19 includes the method of example 18, further comprising depositing an encapsulant adjacent the buffer material, the buffer material to separate the encapsulant from the layers of the bonding materials.

Example 20 includes the method of example 18, wherein the depositing of the buffer material includes depositing a thin film coating along exposed portions of the outer edges of the layers of the bonding materials.

The following claims are hereby incorporated into this Detailed Description by this reference. Although certain example systems, apparatus, articles of manufacture, and methods have been disclosed herein, the scope of coverage of this patent is not limited thereto. On the contrary, this patent covers all systems, apparatus, articles of manufacture, and methods fairly falling within the scope of the claims of this patent.

What is claimed is:

1. An apparatus comprising:
- a package substrate having a cavity;
- a translucent panel;
- a semiconductor substrate supporting an array of microelectromechanical elements, the semiconductor substrate disposed in the cavity;
- a plurality of metallic layers stacked between the translucent panel and the semiconductor substrate to bond the translucent panel to the semiconductor substrate and to at least partially enclose a space between the array of microelectromechanical elements and the translucent panel, the plurality of metallic layers disposed in the cavity;
- a buffer material extending along a lateral side of the plurality of metallic layers, the buffer material including an organic material; and
- an encapsulant between the buffer material and an inner wall of the cavity;
- wherein the buffer material separates the encapsulant from the plurality of metallic layers.

2. The apparatus of claim 1, wherein the buffer material is an organic material and the encapsulant is an inorganic-filled epoxy, the buffer material and the encapsulant having different compositions such that the buffer material has a lower modulus of elasticity than the encapsulant.

3. The apparatus of claim 2, wherein the modulus of elasticity of the buffer material is 5 megapascals or less.

4. The apparatus of claim 2, wherein the semiconductor substrate is mounted to a support surface of the package substrate, the buffer material extending farther away from the support surface than the encapsulant extends away from the support surface.

5. The apparatus of claim 1, wherein the buffer material extends between the translucent panel and the semiconductor substrate along the lateral side of the plurality of metallic layers.

6. The apparatus of claim 1, wherein the buffer material is a thin film coating on the lateral side of the plurality of metallic layers.

7. The apparatus of claim 1, wherein the buffer material comprises silicone extending along the lateral side of the plurality of metallic layers between the translucent panel and the semiconductor substrate, the silicone separating the encapsulant from the plurality of metallic layers.

8. The apparatus of claim 1, wherein the buffer material extends along a perimeter of at least one of the translucent panel or the semiconductor substrate.

9. The apparatus of claim 1, wherein the buffer material surrounds the plurality of metallic layers.

10. The apparatus of claim 1, wherein the semiconductor substrate is attached to the package substrate.

11. The apparatus of claim 10, wherein the cavity is defined by a first surface that is recessed relative to a second surface, the semiconductor substrate attached to the first surface.

12. The apparatus of claim 11, wherein the cavity is defined by a sidewall extending between the first surface and the second surface, the buffer material to be spaced apart from the sidewall.

13. The apparatus of claim 1, wherein the plurality of metallic layers are comprised of at least one of copper, nickel, gold, indium, titanium, or aluminum.

14. A digital micromirror device comprising:
- a semiconductor substrate supporting an array of micromirrors;
- a window spaced apart from the array of micromirrors;
- a plurality of metallic layers coupling the window to the semiconductor substrate, the plurality of metallic layers stacked adjacent a perimeter of the semiconductor substrate and the window to at least partially enclose an open space between the array of micromirrors and the window;
- an organic buffer material in contact with multiple ones of the plurality of metallic layers, the organic buffer material on a side of the plurality of metallic layers opposite the open space, wherein the organic buffer material has a lower modulus of elasticity than the plurality of metallic layers; and
- an encapsulant between the organic buffer material and an inner wall of a cavity in which the semiconductor substrate and the plurality of metallic layers are disposed, the organic buffer material separating the encapsulant from the plurality of metallic layers.

15. The digital micromirror device of claim 14, wherein the encapsulant fills a volume of the cavity surrounding the organic buffer material.

16. The digital micromirror device of claim 14, wherein a shape of an outer surface of the organic buffer material corresponds to a shape profile of the side of the plurality of metallic layers opposite the open space.

17. The digital micromirror device of claim 14, wherein a shape of an outer surface of the organic buffer material is different than a shape profile of the side of the plurality of metallic layers opposite the open space.

18. A method comprising:

bonding, via a plurality of metallic layers, a translucent panel to a semiconductor substrate, the translucent panel to extend across an array of micromirrors on the semiconductor substrate, the plurality of metallic layers stacked to at least partially enclose a space between the array of micromirrors and the translucent panel;

depositing an organic buffer material to outer edges of the plurality of metallic layers, the organic buffer material having a lower modulus of elasticity than the plurality of metallic layers; and depositing, after depositing the organic buffer material, an encapsulant between the organic buffer material and an inner wall of a cavity in which the semiconductor substrate and the plurality of metallic layers are disposed, wherein the organic buffer material separates the encapsulant from the plurality of metallic layers to reduce stress-induced delamination of the plurality of metallic layers.

19. The method of claim 18, wherein the organic buffer material and the encapsulant have different compositions.

20. The method of claim 18, wherein the depositing of the organic buffer material includes depositing a thin film coating along exposed portions of the outer edges of the plurality of metallic layers.

* * * * *